(12) United States Patent
Tsukiyama et al.

(10) Patent No.: US 10,892,251 B2
(45) Date of Patent: Jan. 12, 2021

(54) SEMICONDUCTOR DEVICE

(71) Applicant: TOSHIBA MEMORY CORPORATION, Tokyo (JP)

(72) Inventors: Satoshi Tsukiyama, Yokohama Kanagawa (JP); Hideo Aoki, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,409

(22) Filed: Sep. 3, 2019

(65) Prior Publication Data
US 2020/0303346 A1 Sep. 24, 2020

(30) Foreign Application Priority Data

Mar. 19, 2019 (JP) .................. 2019-051999

(51) Int. Cl.
*H01L 25/065* (2006.01)
*H01L 23/00* (2006.01)
*H01L 23/31* (2006.01)

(52) U.S. Cl.
CPC ...... *H01L 25/0657* (2013.01); *H01L 23/3121* (2013.01); *H01L 24/45* (2013.01); *H01L 24/48* (2013.01); *H01L 2224/45144* (2013.01); *H01L 2224/45164* (2013.01); *H01L 2224/46* (2013.01); *H01L 2224/48145* (2013.01); *H01L 2224/48227* (2013.01); *H01L 2224/49* (2013.01); *H01L 2225/0651* (2013.01); *H01L 2225/06506* (2013.01);

(Continued)

(58) Field of Classification Search
CPC ....... H01L 2224/45144; H01L 2224/46; H01L 2224/49; H01L 2225/0651; H01L 2225/06527; H01L 25/0657; H01L 2924/01079; H01L 2924/014; H01L 2924/1434–1453
See application file for complete search history.

(56) References Cited

U.S. PATENT DOCUMENTS 7,820,913 B2 * 10/2010 Uno .................. B23K 35/0266
174/94 R
8,896,111 B2 11/2014 Tanimoto et al.
9,589,694 B2 * 3/2017 Sarangapani ............. C22C 9/00
(Continued)

FOREIGN PATENT DOCUMENTS

CN 101133493 A 2/2008
CN 102912176 A 2/2013
(Continued)

*Primary Examiner* — David A Zarneke
(74) *Attorney, Agent, or Firm* — Foley & Lardner LLP

(57) ABSTRACT

According to one embodiment, a semiconductor device includes a wiring board, a controller chip that is provided on the wiring board and is sealed with a first resin composition, a nonvolatile memory chip that is provided on the first resin composition and is sealed with a second resin composition, a second bonding wire that connects a pad for electric power supply wiring of the controller chip to the wiring board and is sealed with the first resin composition, and a first bonding wire that connects a pad for signal wiring of the controller chip to the wiring board, is sealed with the first resin composition, and has a higher Pd content than that of the second bonding wire.

7 Claims, 1 Drawing Sheet

(52) U.S. Cl.
CPC   *H01L 2924/014* (2013.01); *H01L 2924/0132* (2013.01); *H01L 2924/01079* (2013.01)

(56)         References Cited

U.S. PATENT DOCUMENTS

| | | | |
|---|---|---|---|
| 9,972,595 B2* | 5/2018 | Antoku | H01L 24/43 |
| 2006/0251538 A1* | 11/2006 | Yun | H01L 24/85 |
| | | | 420/507 |
| 2012/0001336 A1* | 1/2012 | Zeng | H01L 24/05 |
| | | | 257/769 |
| 2012/0118610 A1* | 5/2012 | Terashima | C22C 9/00 |
| | | | 174/126.2 |
| 2013/0164169 A1* | 6/2013 | Lee | B21C 37/047 |
| | | | 420/505 |
| 2016/0078980 A1* | 3/2016 | Sarangapani | H05K 1/0213 |
| | | | 174/250 |
| 2018/0025337 A1 | 1/2018 | Edwards | |

FOREIGN PATENT DOCUMENTS

| | | |
|---|---|---|
| JP | 2015-176906 A | 10/2015 |
| JP | 2017-0168586 A | 9/2017 |
| TW | 201411806 A | 3/2014 |

\* cited by examiner

SEMICONDUCTOR DEVICE

CROSS-REFERENCE TO RELATED APPLICATION

This application is based upon and claims the benefit of priority from Japanese Patent Application No. 2019-051999, filed Mar. 19, 2019, the entire contents of which are incorporated herein by reference.

FIELD

Embodiments described herein relate generally to a semiconductor device.

BACKGROUND

In recent years, a structure of a film on die (FOD) in which a memory chip is stacked on a semiconductor chip through an adhesive resin composition such as a die attach film (DAF) is used for a semiconductor package. However, when semiconductor chips are bonded through a DAF and a gold (Au) bonding wire is connected to an aluminum (Al) electrode pad, chloride (Cl) ions may corrode the Al electrode pad in the DAF, resulting in disconnection between the Al electrode pad and the Au bonding wire.

An example of related art includes JP-A-2017-168586.

DETAILED DESCRIPTION

Embodiments provide a reliable semiconductor device.

In general, according to one embodiment, a semiconductor device includes a wiring board, a controller chip provided on the wiring board and sealed by a first resin layer, a nonvolatile memory chip provided on the first resin layer and the nonvolatile memory chip and the first resin layer are sealed by a second resin layer, a second bonding wire, sealed by the first resin layer, that connects a pad for electric power supply wiring of the controller chip to the wiring board, and a first bonding wire, sealed with by first resin layer, that connects a pad for signal wiring of the controller chip to the wiring board. A palladium (Pd) content of the first bonding wire is greater than a Pd content of the second bonding wire.

Hereinafter, embodiments of the present disclosure will be described with reference to the drawings. The present disclosure is not limited to the embodiments.

In the semiconductor device according to the embodiment, a material that is resistant to corrosion is used for the bonding wire for signal wiring that is connected to the pad of the controller chip that controls the nonvolatile memory chip. Thus, the reliability of the semiconductor device is improved. The semiconductor device will be described in more detail below.

Figure 1:
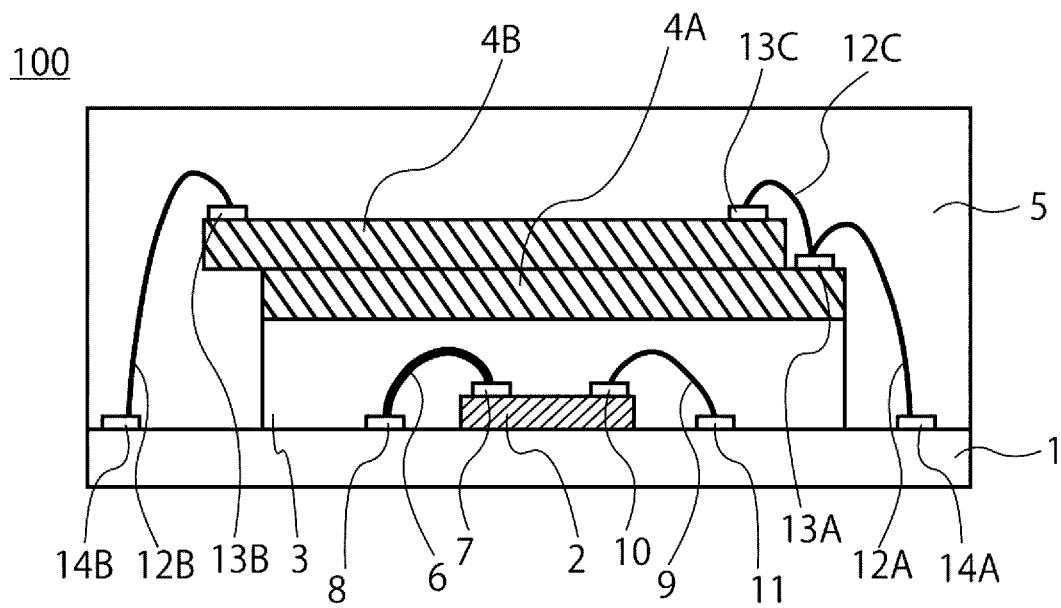
FIG. 1 shows a cross-sectional view schematically illustrating a semiconductor device according to one embodiment.

FIG. 1 is a cross-sectional view schematically illustrating a semiconductor device 100 according to the embodiment. For example, the semiconductor device 100 is a semiconductor package. As illustrated in FIG. 1, the semiconductor device 100 includes a board 1, a controller chip 2, a first resin composition (or first resin layer) 3, a nonvolatile memory chip 4 (4A and 4B), a second resin composition (or second resin layer) 5, a first bonding wire 6, a second bonding wire 9, and a third bonding wire 12 (12A and 12B). In all the drawings, the size ratio and detailed arrangement of components are shown so as to easily understand the embodiments. Therefore, the ratio and arrangement differ from the actual ratio and arrangement. The drawings are schematically shown, and thus wiring on a chip and a board is omitted.

Figure 2:
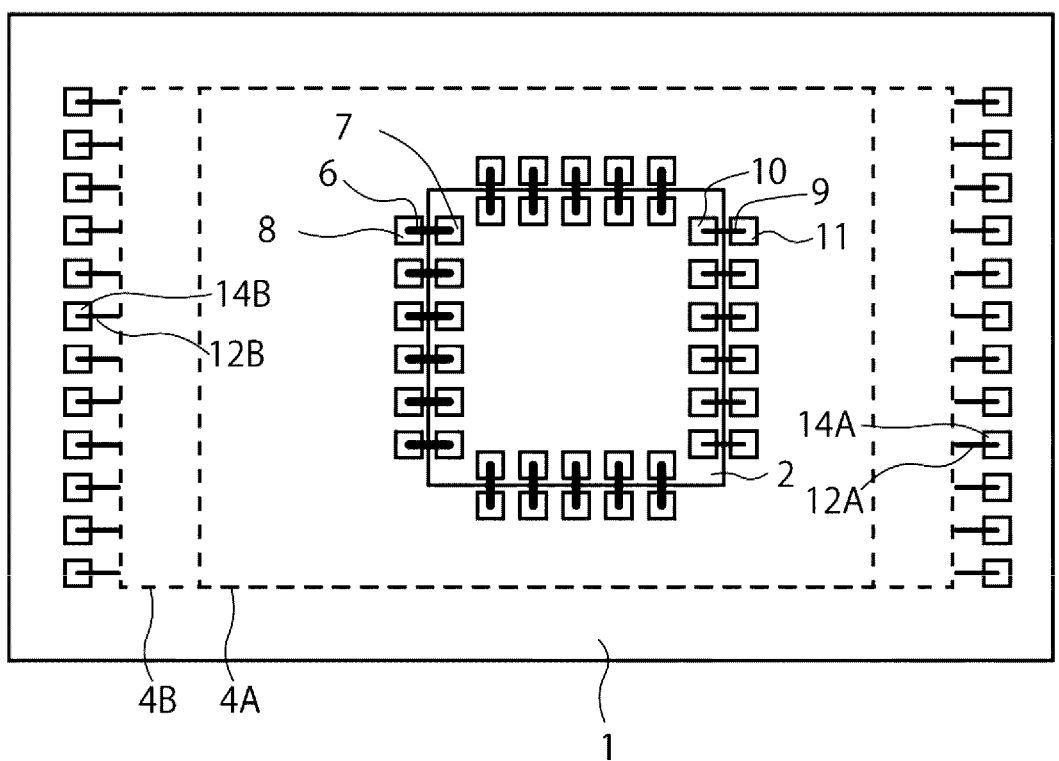
FIG. 2 shows a plan view schematically illustrating a semiconductor device according to one embodiment.

FIG. 2 is a plan view schematically illustrating the semiconductor device 100 according to the embodiment. FIG. 2 illustrates wiring between the board 1 and the controller chip 2, and a positional relationship of the board 1, the controller chip 2, and the nonvolatile memory chip 4. A layout shown in FIG. 2 is one example. A layout of a pad 7 for signal wiring and a pad 11 for electric power supply wiring of the controller chip 2 is also one example. A layout of the semiconductor device 100 may be optionally changed according to a design within the scope of the embodiments.

The board 1 is a wiring board formed from a resin, and the like. Specifically, the board 1 is formed from a wire, a glass cloth, a resin, and the like. A semiconductor package that is the semiconductor device 100 is formed on the board 1. For example, Cu wiring is formed on the board 1, and semiconductor chips in the semiconductor device 100 are connected to each other through the wiring of the board 1. On a surface of the board 1, a resist not shown in the drawings is provided. On a surface of the board 1 on a side opposite to the controller chip 2, a pad connectable to the outside of the semiconductor device 100, which is not shown in the drawings, is provided.

On the controller chip 2-side surface of the board 1, the pad 7 for signal wiring and the pad 10 for electric power supply wiring that are connected to the controller chip 2 are provided. The pad 7 for signal wiring and the pad 10 for electric power supply wiring are sealed with the first resin composition 3. On the surface of the board 1 on the side of the controller chip 2, electrode pads 14A and 14B that are connected to nonvolatile memory chips 4A and 4B are provided. The electrode pads 14A and 14B are sealed with the second resin composition 5.

The controller chip 2 is a semiconductor chip that is fixed on the board 1, for example, by an adhesive such as a DAF having a thickness of 10 μm to 20 μm. The controller chip 2 is connected to the outside of the semiconductor device 100, controls reading from and writing on the nonvolatile memory chip 4, and for example, conducts faster reading and writing, error correction, and the like. Since the controller chip 2 is not a flip chip, an electrode pad of the controller chip 2 is disposed on a side opposite to the board 1.

It is preferable that the controller chip 2 be disposed below the center of the nonvolatile memory chip 4A disposed on a side near the controller chip 2. It is preferable that the nonvolatile memory chip 4A be disposed so that the center (center of inscribed circle) of the nonvolatile memory chip 4A that is projected to the board 1 overlaps with the controller chip 2. When the controller chip 2 is disposed below the center of the nonvolatile memory chip 4A, the dispersion of impedance of wiring for connecting the controller chip 2 to the nonvolatile memory chip 4A can be reduced. This is useful for faster reading and writing.

The controller chip 2, the first bonding wire 6, and the second bonding wire 9 are sealed with the first resin composition 3. The first resin composition 3 is disposed between the board 1 and the nonvolatile memory chip 4A. Typically, the first resin composition 3 has a thickness between 100 micrometers (μm) and 150 μm. Specifically, the first resin composition 3 is a DAF. The first resin composition 3 is a resin having higher ionic conductivity than that of the second resin composition 5. When the moisture content of the resin composition is high, the ion conductivity of the resin composition is high. In the embodiment, a resin composition containing a lower content of filler and a higher content of resin component is used as the first resin composition 3.

The content of the filler such as silicon particles in the first resin composition 3 is between 40 wt % and 60 wt %, in some embodiments. When the content of the filler is too low, the strength is insufficient. When the content of the filler is too high, the first resin composition 3 is too hard, and the first bonding wire 6 and the second bonding wire 9 may be destroyed during bonding the first resin composition 3. The elasticity (25° C.) of the first resin composition 3 under the same condition is between 0.7 GPa and 3.0 GPa. In the first resin composition 3, the content of the filler is low, and thus the content of the resin is high. The first resin composition 3 substantially contains the filler and the resin, and contains a trace of additive. In the embodiment, the content of the resin in the first resin composition 3 may be considered as [100 wt %−[content of filler]]. The first resin composition 3 containing a higher content of the resin has a higher moisture content than that of the second resin composition 5, and thus the ionic conductivity is high. The first resin composition 3 may contain an additive such as an ion trapping agent. Halogen that corrodes an electrode pad is derived from a substance that remains during production of the semiconductor device 100 or a substance that is generated by hydrolysis of the resist. Even when the ion trapping agent is contained in the first resin composition 3, all halogen ions cannot be trapped. Therefore, a palladium gold (PdAu) wire is suitably used for the first bonding wire 6.

Since the nonvolatile memory chip 4 is disposed above the controller chip 2, the controller chip 2 is sealed with the DAF. When the controller chip 2 is disposed beside the nonvolatile memory chip 4, the controller chip 2 may be sealed with a mold like the nonvolatile memory chip 4. Therefore, corrosion is unlikely to proceed, and disconnection between the bonding wire and a pad portion hardly occurs. However, the nonvolatile memory chip 4 is disposed above the controller chip 2. Therefore, the controller chip 2 and the first bonding wire 6 are sealed with the first resin composition 3 that is soft enough to prevent destruction of the first bonding wire 6 and has adhesiveness. When a wire containing an alloy that tends to be corroded, such as $AuAl_4$, is in a member sealed with the first resin composition 3, more specifically, when an alloy such as $AuAl_4$ is formed in an electrode pad, disconnection is likely to occur. In the embodiment, for a material for the first bonding wire 6, a material that is unlikely to corrode an electrode pad is selected.

The nonvolatile memory chip 4 (4A and 4B) is a memory chip provided on the first resin composition 3. For the nonvolatile memory chip 4, a NAND memory chip, a phase-change memory chip, a resistance-change memory chip, a ferroelectric memory chip, a magnetic memory chip, or the like may be used. It is preferable that the nonvolatile memory chip 4A be fixed with an adhesive that is provided between the nonvolatile memory chip 4 and the first resin composition 3 and is not shown in the drawings. The nonvolatile memory chip 4 is a memory chip in which data are written or read. As illustrated in FIG. 1, the nonvolatile memory chip 4B is shifted and stacked so as to allocate a region for an electrode pad 13A on the nonvolatile memory chip 4A, forming one memory array as a whole. Thus, the semiconductor device 100 in which two or more nonvolatile memory chips 4 are stacked may be produced. According to a configuration, the semiconductor device 100 including only one nonvolatile memory chip 4A may be produced.

The first resin composition 3, the nonvolatile memory chip 4, and the third bonding wire 12 (12A and 12B) are sealed with the second resin composition 5. The second resin composition 5 is provided on the board 1. The second resin composition 5 is a so-called mold resin, and is a member containing a high content of filler and having excellent strength. The content of the filler in the second resin composition 5 is preferably between 80 wt % and 90 wt %. When the content of the filler is too low, the strength is insufficient. When the content of the filler is too high, the content of the resin component is low, and a structure is unlikely to be maintained. The elasticity (25° C.) of the second resin composition 5 under the same condition is preferably between 20 GPa and 30 GPa. The second resin composition 5 substantially contains the fillers and the resin, and contains a trace of additive. In the embodiment, the content of the resin in the second resin composition 5 may be conveniently considered as [100 wt %−[content of filler]].

In comparison of the first resin composition 3 with the second resin composition 5, the content of the filler in the second resin composition 5 is more than or equal to 1.5 times and less than or equal to 2.0 times that in the first resin composition 3. Therefore, the content of the filler in the first resin composition 3 largely differs from that in the second resin composition 5. In the first resin composition 3, the content of the filler is low, and thus the moisture content is high and an electrode pad is likely to be corroded.

The first bonding wire 6 is a wire for connecting the board 1 to the controller chip 2. Plural first bonding wires 6 may be provided. The first bonding wire 6 is for signal wiring between the controller chip 2 and an element connected to the outside of the semiconductor device 100 or signal wiring between the controller chip 2 and the nonvolatile memory chip. The first bonding wire 6 connects an electrode pad 8 of the board 1 to the pad 7 for signal wiring of the controller chip 2. The pad 7 for signal wiring is an I/O electrode pad of the controller chip 2. Typically, the first bonding wire 6 has a diameter between 10 μm and 100 μm.

The second bonding wire 9 is a wire for connecting the board 1 to the controller chip 2. Plural second bonding wires 9 may be provided. The second bonding wire 9 is for wiring for electric power supply of the controller chip 2. The second bonding wire 9 connects the electrode pad 11 of the board 1 to the pad 10 for electric power supply wiring of the controller chip 2. The pad 10 for electric power supply wiring is an electrode pad for electric power supply of the controller chip 2. Typically, the second bonding wire 9 has a diameter between 10 μm and 100 μm.

The electrode pads 8, 11, and 14 of the board 1 are made, for example, by plating a terminal made of copper (Cu) with nickel (Ni), gold (Au), or both Ni and Au. The pad 7 for signal wiring and the pad 10 for electric power supply wiring of the controller chip 2 are pads made of Al.

The first bonding wire 6 and the second bonding wire 9 are sealed with the first resin composition 3 that has higher ionic conductivity than that of the second resin composition 5. In the first resin composition 3, for example, corrosive halogen ions such as $Cl^-$ are easily shifted to the electrode pads by potential difference applied to the pads. Even when the first resin composition contains $Cl^-$ in a trace amount of approximately 0.2 ppm on average, $Cl^-$ is gathered in the electrode pads by applied voltage. As a result, the $Cl^-$ concentration is locally increased around the electrode pads of the controller chip 2, and the alloy formed on the electrode pads of the controller chip 2, such as $AuAl_4$, is likely to be corroded.

When a bonding wire made of Au is substantially connected to an electrode pad made of Al, an alloy of Au and Al, such as $AuAl_4$, is formed on the electrode pad. This alloy is reacted with halogen ions such as $Cl^-$ and $Br^-$, resulting in corrosion. When the corrosion proceeds, the electrode pad and the bonding wire are disconnected. In a material through which ions are hardly conducted, like the second resin composition 5, corrosion that leads to disconnection is unlikely to proceed. A material through which ions tend to be conducted, like the first resin composition 3, has a problem in which the reliability of the semiconductor device 100 is deteriorated.

Since the first bonding wire 6 is for signal wiring, the first bonding wire 6 is a non-redundant wire. Therefore, even when one part of wiring formed of the first bonding wire 6 is disconnected, the semiconductor device 100 causes an operation failure. For the first bonding wire 6, a PdAu (PdAu alloy) wire containing a higher content of Pd, which is resistant to corrosion, than that of the second bonding wire 9 is used.

The first bonding wire 6 is preferably a PdAu alloy wire having a Pd content between 0.05 wt % and 2.00 wt %. When 0.05 wt % or more of Pd is contained, the corrosion resistance of the first bonding wire 6 is improved. A metal other than Pd that is contained in the first bonding wire 6 is substantially Au except for unavoidable metal (0.02 wt % or less). In signal wiring, an increase in resistance is not too important as compared with impedance. Since Pd has higher resistance than that of Au, an excessively large amount of Pd is not preferable. The Pd content in the first bonding wire 6 is preferably less than or equal to 2.00 wt %. When the Pd content is high, the bonding wire is hard, and wiring is likely difficult to be made. Therefore, the Pd content may be less than or equal to 2.00 wt %. When the first bonding wire 6 formed as a PdAu wire, the pad 7 for signal wiring is unlikely to be disconnected. Therefore, in terms of freely selecting the ion trapping agent for the first resin composition 3 and increasing options of member for the first resin composition 3, the semiconductor device 100 of the embodiment is preferable.

The second bonding wire 9 is sealed with the first resin composition 3, similarly to the first bonding wire 6. Unlike the first bonding wire 6, the second bonding wire 9 is for electric power supply wiring, and thus the second bonding wire 9 is redundant. Through the second bonding wire 9, the pad 10 for electric power supply wiring that is the electrode pad made of Al on an upper surface of the controller chip 2 is connected to the electrode pad 11 made by plating Cu of the board 1, for example, with Ni and Au. The pad 10 for electric power supply wiring of the controller chip 2 is likely to be corroded like the pad 7 for signal wiring.

However, even when one part of wiring formed of a plurality of second bonding wires 9 is disconnected, a route from an electric power supply to the controller chip 2 remains because of the redundant second bonding wires 9, so that the controller chip 2 and the semiconductor device 100 can be operated. For the second bonding wires 9, a PdAu wire may also be used. However, in electric power supply wiring, an increase in resistance is not preferable. Therefore, it is not preferable that the second bonding wires 9 contain Pd. Accordingly, the Pd content in the second bonding wires 9 is lower than that in the first bonding wire 6. The second bonding wires 9 are a wire substantially made of Au. The Pd content in the second bonding wires 9 is preferably less than or equal to 0.01 wt %. The second bonding wires 9 may contain an unavoidable metal (0.02 wt % or less), like the first bonding wire 6. The second bonding wires 9 are suitably an Au wire that is substantially made of Au except for the unavoidable metal, and has a Pd content of less than or equal to 0.01 wt %.

The third bonding wire 12 (12A, 12B, or 12C) is sealed with the second resin composition 5 and is a bonding wire for wiring of the nonvolatile memory chip 4. The electrode pad 14 (14A and 14B) on a side of the board 1 to be connected to the third bonding wire 12 is, for example, a pad made by plating copper (Cu) with nickel (Ni) and gold (Au). On the other hand, the electrode pad 13 (13B and 13C) on a side of the nonvolatile memory chip 4 to be connected to the third bonding wire 12 is a pad made of aluminum (Al). Therefore, the alloy, such as $AuAl_4$, formed on a portion where the electrode pad 13 on the side of the nonvolatile memory chip 4 is conjugated to the third bonding wire 12 is likely to be corroded by $Cl^-$ or the like. In contrast, the third bonding wire 12 is unlikely to be corroded since the third bonding wire 12 is sealed with the second resin composition 5.

It is preferable that the third bonding wire 12 be an Au wire substantially made of Au since the third bonding wire 12 is sealed with the second resin composition 5. For the third bonding wire 12, a PdAu wire may be used. However, it is not suitable that the PdAu wire is used for the third bonding wire 12. This is because the PdAu wire is harder than the Au wire substantially made of Au, and for example, the longest wire length of the third bonding wire 12 is twice longer than the average wire length of the first bonding wire 6. The PdAu wire has higher resistance than that of the Au wire. Therefore, when the nonvolatile memory chips 4 stacked in multiple layers are connected to the PdAu wire, voltage drop at an upper side is increased. It is necessary to increase the applied voltage in consideration of voltage drop. Accordingly, it is suitable that the Au wire is used for the third bonding wire 12. Typically, the third bonding wire 12 has a diameter between 10 μm and 100 μm.

In the specification, only atomic symbols are used to express some elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a wiring board;
a controller chip provided on the wiring board, the controller chip sealed by a first resin layer;
a nonvolatile memory chip provided on the first resin layer, the nonvolatile memory chip and the first resin layer sealed by a second resin layer;
a second bonding wire, sealed by the first resin layer, that connects a pad for electric power supply wiring of the controller chip to the wiring board; and
a first bonding wire, sealed by the first resin layer, that connects a pad for signal wiring of the controller chip to the wiring board, wherein a palladium (Pd) content of the first bonding wire is greater than a Pd content of the second bonding wire.

2. The semiconductor device according to claim 1, further comprising:
a third bonding wire, sealed by the second resin layer, that connects the nonvolatile memory chip to the wiring board and has a Pd content less than the Pd content of the first bonding wire,
wherein the first bonding wire is formed of PdAu alloy with the Pd content in a range equal to or greater than 0.05 wt % and equal to or less than 2.00 wt %,
each of the second bonding wire and the third bonding wire has the respective Pd content less than or equal to 0.01 wt % and is substantially made of Au, and
the pad for signal wiring and the pad for electric power supply wiring of the controller chip includes an aluminum (Al) pad.

3. The semiconductor device according to claim 1,
wherein the first bonding wire is a non-redundant wire, which causes operation failure of the controller chip when disconnected, and
the second bonding wire is a redundant wire, which does not cause operation failure of the controller chip when disconnected.

4. The semiconductor device according to claim 1,
wherein a portion of the nonvolatile memory chip and the controller chip overlap with each other along a stacking direction of the wiring board and the controller chip.

5. The semiconductor device according to claim 1,
wherein the first resin layer has a filler content in a range equal to or greater than 40 wt % and equal to or less than 60 wt %.

6. The semiconductor device according to claim 1, wherein an ionic conductivity of the first resin layer is greater than an ionic conductivity of the second resin layer.

7. The semiconductor device according to claim 1, wherein the first resin layer includes a die attach film (DAF).

* * * * *